United States Patent
Knight et al.

(10) Patent No.: US 11,227,772 B2
(45) Date of Patent: Jan. 18, 2022

(54) MULTI-MODAL DIAMOND ABRASIVE PACKAGE OR SLURRY FOR POLISHING HARD SUBSTRATES

(71) Applicant: Eminess Technologies, LLC, Monroe, NC (US)

(72) Inventors: Terry Michael Knight, Chandler, AZ (US); William Rollins Gemmill, Indian Trail, NC (US); Keith Harris Joye, Matthews, NC (US); Tony Russell Martin, Concord, NC (US)

(73) Assignee: PUREON INC., Scottsdale, AZ (US)

( * ) Notice: Subject to any disclaimer, the term of this patent is extended or adjusted under 35 U.S.C. 154(b) by 0 days.

(21) Appl. No.: 16/777,485

(22) Filed: Jan. 30, 2020

(65) Prior Publication Data
US 2020/0251342 A1   Aug. 6, 2020

Related U.S. Application Data

(60) Provisional application No. 62/799,730, filed on Jan. 31, 2019.

(51) Int. Cl.
*H01L 21/306* (2006.01)
*C09G 1/02* (2006.01)
*C09K 3/14* (2006.01)

(52) U.S. Cl.
CPC .......... *H01L 21/30625* (2013.01); *C09G 1/02* (2013.01); *C09K 3/1409* (2013.01); *C09K 3/1463* (2013.01)

(58) Field of Classification Search
None
See application file for complete search history.

(56) References Cited

U.S. PATENT DOCUMENTS

| | | | |
|---|---|---|---|
| 4,218,852 A | 8/1980 | Rademacher | |
| 5,527,370 A | 6/1996 | Kubo et al. | |
| 6,375,694 B1 | 4/2002 | Roberts et al. | |
| 6,663,682 B2 | 12/2003 | Baldoni et al. | |
| 6,896,591 B2 * | 5/2005 | Chaneyalew | C09G 1/02 451/287 |

(Continued)

FOREIGN PATENT DOCUMENTS

| | | | |
|---|---|---|---|
| WO | 2009131556 | * | 10/2009 |
| WO | 2016168231 | * | 10/2016 |

OTHER PUBLICATIONS

International Search Report and Written Opinion for corresponding International Application No. PCT/US2020-015908 dated Apr. 9, 2020.

*Primary Examiner* — Stephanie P Duclair
(74) *Attorney, Agent, or Firm* — Jeffrey C. Watson; Grell & Watson Patent Attorneys LLC

(57) ABSTRACT

A multi-modal diamond abrasive package or slurry is disclosed for polishing hard substrates. The multi-modal diamond abrasive package or slurry generally includes a plurality of diamond abrasives. Each one of the diamond abrasives of the plurality of diamond abrasives has a particle size. Wherein, the multi-modal diamond abrasive package or slurry includes a first diamond abrasive and a second diamond abrasive. The first diamond abrasive has a first particle size, and the second diamond abrasive has a second particle size. Where, the first particle size of the first diamond abrasive is smaller than the second particle size of the second diamond abrasive.

13 Claims, 6 Drawing Sheets

(56) References Cited

U.S. PATENT DOCUMENTS

| | | | |
|---|---|---|---|
| 7,255,809 B2 * | 8/2007 | Horie | C09G 1/02 |
| | | | 216/88 |
| 7,410,410 B2 | 8/2008 | Mahadev et al. | |
| 8,691,364 B2 | 4/2014 | Hasegawa et al. | |
| 8,702,479 B2 | 4/2014 | Huang et al. | |
| 8,715,381 B2 | 5/2014 | Ramanath et al. | |
| 8,980,113 B2 * | 3/2015 | Wang | C09K 3/1409 |
| | | | 216/89 |
| 9,493,677 B2 | 11/2016 | Lim et al. | |
| 9,868,187 B2 | 1/2018 | Nagai et al. | |
| 10,017,390 B2 | 7/2018 | Johnson et al. | |
| 10,329,455 B2 | 6/2019 | Sines et al. | |
| 2009/0047787 A1 | 2/2009 | Li et al. | |
| 2009/0285744 A1 | 11/2009 | Sugihara et al. | |
| 2011/0005143 A1 | 1/2011 | Aoki et al. | |
| 2011/0223840 A1 | 9/2011 | Morinaga et al. | |
| 2014/0345863 A1 | 11/2014 | Ladva et al. | |
| 2019/0255676 A1 | 8/2019 | Onyenemezu et al. | |

* cited by examiner

MULTI-MODAL DIAMOND ABRASIVE PACKAGE OR SLURRY FOR POLISHING HARD SUBSTRATES

CROSS-REFERENCE TO RELATED APPLICATIONS

This application claims benefit of priority application, U.S. Provisional Ser. No. 62/799,730 filed Jan. 31, 2019 entitled "Multi-Modal Diamond Abrasive Package or Slurry for Polishing Hard Substrates", which is incorporated herein by reference in its entirety.

FIELD OF THE DISCLOSURE

The present disclosure relates to polishing slurry for the polishing of hard substrates. More specifically, the present disclosure is directed toward a polishing slurry containing diamond abrasive particles for the polishing of hard substrates such as silicon carbide (SiC), sapphire, gallium nitride (GaN), or optical materials.

BACKGROUND

The present disclosure relates to a polishing composition that may be used for lapping or polishing a workpiece, like a workpiece made of silicon carbide (SiC), sapphire, or gallium nitride (GaN). The typical polishing composition is a water-based composition that may contain other co-solvents, rheology modifiers, diamond abrasives, pH modifiers, other abrasives such as $SiO_2$, or $Al_2O_3$ or surfactants and dispersants. The manufacturing of SiC wafers requires that large single crystals of SiC be grown and from the single crystals thin wafer blanks are obtained by wire sawing the single crystals. Subsequent processing is required to improve the surface finish and geometry of the wafer and this is performed via mechanical polishing with a diamond-based slurry. This diamond-based slurry is capable of polishing the wafers to a quality required for a chemical mechanical planarization (CMP) process that prepares the wafers for ultimate use as substrates for the manufacture of electronic devices, like integrated circuits.

Diamond based polishing compositions are widely used for mechanical polishing of substrates owing to the high hardness of the diamond abrasive compared to the workpiece which results in productive material removal. There are many manufacturers of diamond slurries and the diamond abrasive itself can take the form of monocrystalline, polycrystalline, or some hybrid type of diamond abrasive. As an example, U.S. Pat. No. 8,980,113, incorporated herein in its entirety, discloses a chemical mechanical planarization using nanodiamond. In other words, U.S. Pat. No. 8,980,113 discloses a slurry for hard substrate polishing utilizing nanodiamonds in the slurry. Typical diamond particle sizes used in the mechanical polishing of SiC wafers are on the order of 0.01 to 10 microns, and some process steps progressively smaller diamond abrasives that improve surface quality while reducing removal rate to achieve the desired wafer geometry and surface quality. The bulk of the processing time is found to be in the mechanical polishing processes in between wire saw and CMP therefore it is of great technological interest to develop a polishing slurry containing diamond that provides high material removal rates (MRR) to decrease processing time for the production of SiC wafers as well as other hard materials.

Typical diamond slurries contain a diamond abrasive with diamond concentrations greater than 100 ct/gallon, are sometimes oil based which is a burden for disposal and the environment, and may contain other chemical components such as oxidizers which are also difficult to dispose. Limitations with existing diamond polishing slurries include slow material removal rates, high cost due to large diamond concentrations, and the use of hazardous or difficult to dispose of components.

The instant disclosure of a multi-modal diamond abrasive package or slurry for polishing hard substrates may be designed to address at least certain aspects of the problems discussed above.

SUMMARY

The present disclosure solves the aforementioned limitations of the currently available diamond slurries through the use of a multi-modal diamond abrasive package. The use of a multi-modal diamond abrasive package allows for the realization of higher than expected removal rates with a lower diamond abrasive loading in the slurry all the while maintaining the water based environmentally friendly composition. The disclosed multi-modal diamond abrasive package or slurry is disclosed for polishing hard substrates. The disclosed multi-modal diamond abrasive package or slurry may generally include a plurality of diamond abrasives. Each one of the diamond abrasives of the plurality of diamond abrasives may have a particle size. Wherein, the multi-modal diamond abrasive package or slurry may include a first diamond abrasive and a second diamond abrasive. The first diamond abrasive may have a first particle size, and the second diamond abrasive may have a second particle size. Where, the first particle size of the first diamond abrasive may be smaller than the second particle size of the second diamond abrasive, or vice versa.

One feature of the disclosed multi-modal diamond abrasive package or slurry may be that it can be configured to maintain or allow for higher material removal rates with a lower diamond abrasive loading in the slurry.

Another feature of the disclosed multi-modal diamond abrasive package or slurry may be that the multi-modal diamond abrasive package or slurry can maintain a water based environmentally friendly composition.

Another feature of the disclosed multi-modal diamond abrasive package or slurry may be that it can be configured to provide improvement in a material removal rate while allowing for a reduced concentration of diamonds needed to obtain the improved material removal rate.

Another feature of the disclosed multi-modal diamond abrasive package or slurry may be that it can be configured to provide improvement rates in material removal for both faces of the hard substrate while maintaining a relatively low total concentration of diamonds in the slurry.

In select embodiments of the disclosed multi-modal diamond abrasive package or slurry, the relatively low total concentration of diamonds in the slurry is approximately 80 ct/gallon or less. Wherein the provided improvement in material removal rate at approximately the same total concentration of diamonds in the slurry is approximately 10% or more.

In select embodiments of the disclosed multi-modal diamond abrasive package or slurry, the first particle size of the first diamond abrasive may be between 0.01 microns and 3.00 microns, and the second particle size of the second diamond abrasive may be between 0.5 microns and 10 microns. In select possibly preferred embodiments, the first particle size of the first diamond abrasive may be 0.5 microns, and the second particle size of the second diamond abrasive may be 1 micron or 3 microns.

Another feature of the disclosed multi-modal diamond abrasive package or slurry may be to provide improvements in material removal rates for both faces of a silicon carbide wafer while maintaining a relatively low total concentration of diamonds in the slurry. In select embodiments of the disclosed multi-modal diamond abrasive package or slurry, the relatively low total concentration of diamonds in the slurry may include an 80 ct/gallon slurry, where the first particle size of 0.5 microns is 17 ct/gallon, and the second particle size of 3 microns is 63 ct/gallon. In other select embodiments of the disclosed multi-modal diamond abrasive package or slurry, the relatively low total concentration of diamonds in the slurry may include a 50 ct/gallon slurry, where the first particle size of 0.5 microns is 11 ct/gallon, and the second particle size of 3 microns is 39 ct/gallon. In these embodiments, the improvements in material removal rates of the 80 ct/gallon slurry or the 50 ct/gallon slurry may surpass the material removal rates observed using a 3 micron diamond concentration of 160 ct/gallon.

In select embodiments of the disclosed multi-modal diamond abrasive package or slurry, a ratio of the first particle size of the first diamond abrasive, and the second particle size of the second diamond abrasive may be between 60/40 and 10/90. In select possibly preferred embodiments, the ratio of the first particle size of the first diamond abrasive, and the second particle size of the second diamond abrasive may be approximately between 20/80 and 10/90. In select possibly most preferred embodiments, the ratio of the first particle size of the first diamond abrasive, and the second particle size of the second diamond abrasive may be approximately or equal to 20/80.

In select embodiments of the disclosed multi-modal diamond abrasive package or slurry, the first particle size of the first diamond abrasive may be 0.5 microns, and the second particle size of the second diamond abrasive may be 1 micron or 3 microns.

Another feature of the disclosed multi-modal diamond abrasive package or slurry may be that it can be configured to enable a cost savings. In select embodiments, the cost savings may be via a substitution of expensive polycrystalline diamond powder with inexpensive monocrystalline diamond powder while minimizing the reduction in a material removal rate. The percentage of cost savings may be greater than a percentage of reduction in material removal rate. In select embodiments, the percentage of cost savings may be approximately 3 times or more greater than the percentage of reduction in material removal rate.

In another aspect, the instant disclosure embraces a multi-modal diamond abrasive package or slurry in any of the various embodiments or combinations of embodiments as shown and/or described herein.

In another aspect, the instant disclosure embraces a method of polishing of hard substrates. The instant method of polishing of hard substrates may generally include the step of providing the multi-modal diamond abrasive package or slurry in any of the various embodiments or combinations of embodiments shown and/or described herein. As such, the provided multi-modal diamond abrasive package or slurry for polishing the hard substrates may include the plurality of diamond abrasives, where each one of the diamond abrasives of the plurality of diamond abrasives has a particle size. The multi-modal diamond abrasive package or slurry can include a first diamond abrasive with a first particle size, and a second diamond abrasive with a second particle size. Wherein, the first particle size of the first diamond abrasive may be smaller than the second particle size of the second diamond abrasive. With the provided multi-modal diamond abrasive package or substrate, the method may further include the step of polishing the hard substrate with the provided multi-modal diamond abrasive package or slurry.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The present disclosure will be better understood by reading the Detailed Description with reference to the accompanying drawings, which are not necessarily drawn to scale, and in which like reference numerals denote similar structure and refer to like elements throughout, and in which.

Figure 1:
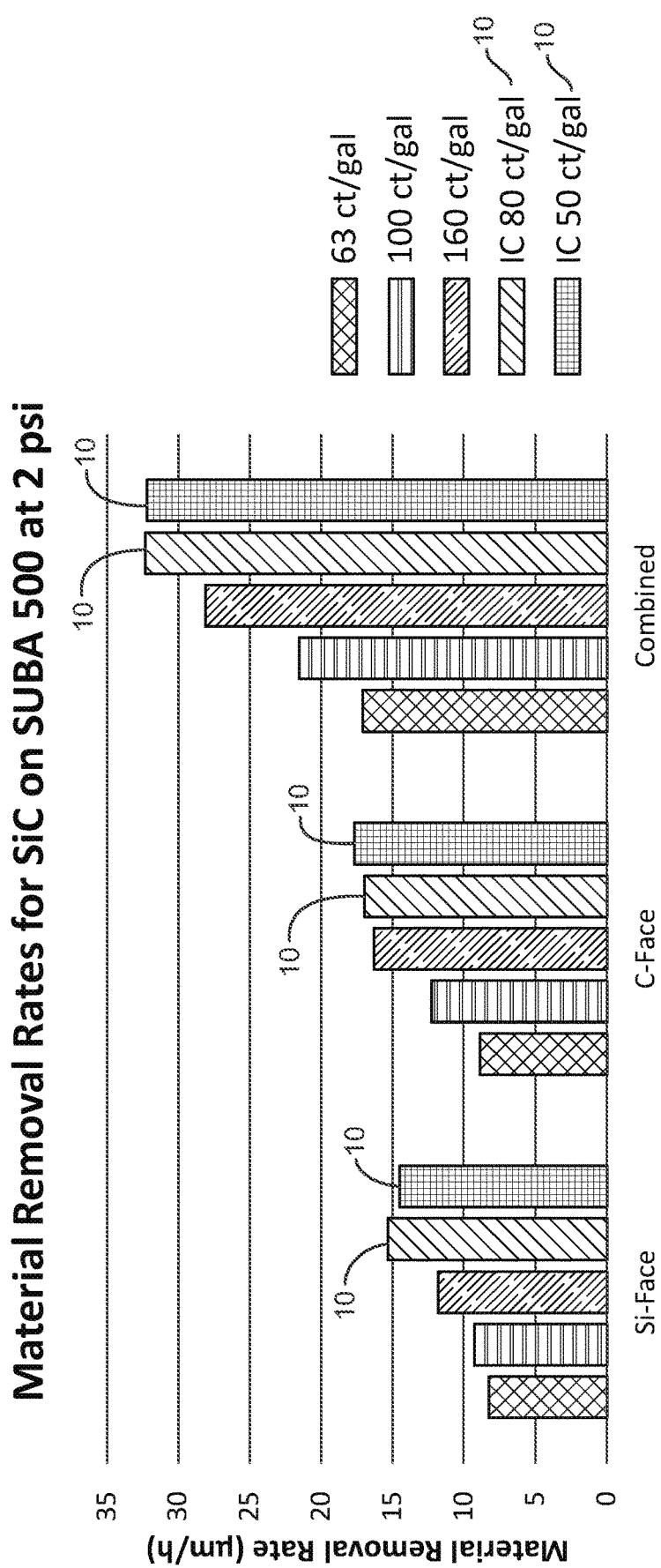
FIG. 1 is a bar graph of material removal rates of the various compositions of slurries listed in Tables 1 and 2 according to select embodiments of the instant disclosure in micrometers per hour ($\mu$m/h) for silicon carbide (SiC) on a Suba™ 500 polishing pad from Eminess Technologies of Scottsdale, Ariz. at 2 psi (Suba™ is a trademark of DuPont Corporation of Wilmington, Del. Eminess is an authorized representative of Dupont Electronics & Imaging)

It is to be noted that the drawings presented are intended solely for the purpose of illustration and that they are, therefore, neither desired nor intended to limit the disclosure to any or all of the exact details of construction shown, except insofar as they may be deemed essential to the claimed disclosure.

DETAILED DESCRIPTION

Referring now to FIGS. 1-6, in describing the exemplary embodiments of the present disclosure, specific terminology is employed for the sake of clarity. The present disclosure, however, is not intended to be limited to the specific terminology so selected, and it is to be understood that each specific element includes all technical equivalents that operate in a similar manner to accomplish similar functions. Embodiments of the claims may, however, be embodied in many different forms and should not be construed to be limited to the embodiments set forth herein. The examples set forth herein are non-limiting examples and are merely examples among other possible examples.

Referring now to FIGS. 1-6, in a possibly preferred embodiment, the present disclosure overcomes the above-mentioned disadvantages and meets the recognized need for such an apparatus or method by providing of the disclosed multi-modal diamond abrasive package or slurry 10, and method 200 of use thereof for polishing hard substrates with the disclosed multi-modal diamond abrasive package or slurry 10. The present disclosure solves the aforementioned limitations of the currently available diamond slurries through the use of a multi-modal diamond abrasive package or slurry 10. The use of the disclosed multi-modal diamond abrasive package or slurry 10 allows for the realization of higher than expected removal rates with a lower diamond abrasive loading in the slurry 10 all the while maintaining the water based environmentally friendly composition. The disclosed multi-modal diamond abrasive package or slurry 10 is disclosed for polishing hard substrates, including, but not limited to silicon carbide (SiC), sapphire, or gallium nitride (GaN), the like, or combinations thereof. As an example, the disclosed multi-modal diamond abrasive package or slurry 10 may be used for polishing SiC wafers.

The disclosed multi-modal diamond abrasive package or slurry 10 may generally include a plurality of diamond abrasives. Each one of the diamond abrasives of the plurality of diamond abrasives may have a particle size. Wherein, the multi-modal diamond abrasive package or slurry 10 may include a first diamond abrasive and a second diamond abrasive. The first diamond abrasive may have a first particle size, and the second diamond abrasive may have a second particle size. Where, the first particle size of the first diamond abrasive may be smaller than the second particle size of the second diamond abrasive, or vice versa.

Referring to FIGS. 1-5, one feature of the disclosed multi-modal diamond abrasive package or slurry 10 may be that it can be configured to maintain or allow for higher material removal rates with a lower diamond abrasive loading in the slurry 10. Another feature of the disclosed multi-modal diamond abrasive package or slurry 10 may be that the multi-modal diamond abrasive package or slurry 10 can maintain a water based environmentally friendly composition. As shown in FIGS. 1-5, another feature of the disclosed multi-modal diamond abrasive package or slurry 10 may be that it can be configured to provide improvement in a material removal rate while allowing for a reduced concentration of diamonds needed to obtain the improved material removal rate.

Figure 2:
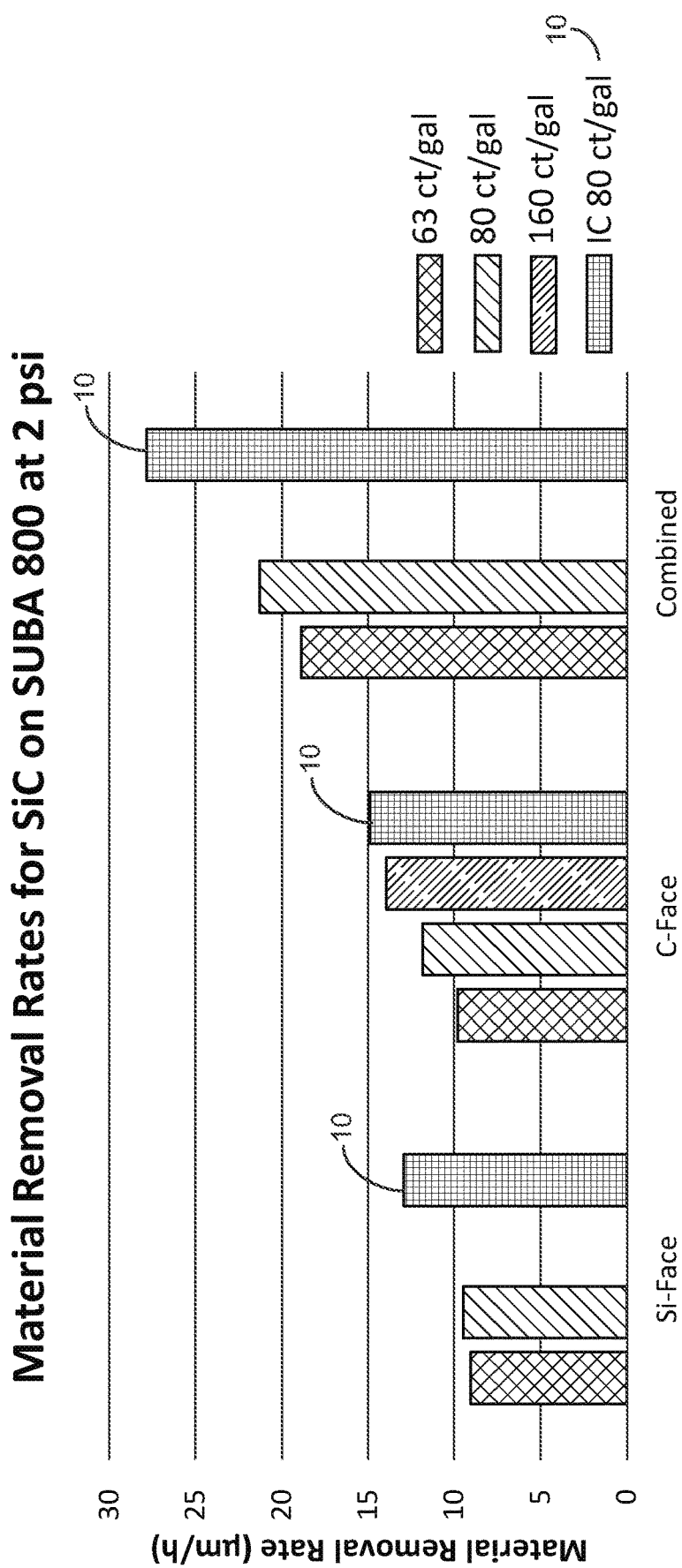
FIG. 2 is a bar graph of material removal rates of the various compositions of slurries listed in Table 3 according to select embodiments of the instant disclosure in micrometers per hour ($\mu$m/h) for silicon carbide (SiC) on a Suba™ 800 polishing pad from Eminess Technologies of Scottsdale, Ariz. at 2 psi.

Referring now specifically to FIGS. 1-2, another feature of the disclosed multi-modal diamond abrasive package or slurry 10 may be that it can be configured to provide improvement rates in material removal for both faces of the hard substrate while maintaining a relatively low total concentration of diamonds in the slurry 10. As shown in FIGS. 1-2, in select embodiments of the disclosed multi-modal diamond abrasive package or slurry 10, the relatively low total concentration of diamonds in the slurry 10 may be approximately 80 ct/gallon or less. Wherein the provided improvement in material removal rate at approximately the same total concentration of diamonds in the slurry 10 is approximately 10% or more.

In select embodiments of the disclosed multi-modal diamond abrasive package or slurry 10, the first particle size of the first diamond abrasive may be between 0.01 microns and 3.000 microns, and the second particle size of the second diamond abrasive may be between 0.5 microns and 10 microns. In select possibly preferred embodiments, the first particle size of the first diamond abrasive may be 0.5 microns, and the second particle size of the second diamond abrasive may be 1 micron (as shown in FIG. 4) or 3 microns (as shown in FIGS. 1-3 and 5).

As shown in FIGS. 1-5, another feature of the disclosed multi-modal diamond abrasive package or slurry 10 may be to provide improvements in material removal rates for both faces of a silicon carbide wafer while maintaining a relatively low total concentration of diamonds in the slurry 10. As an example, and clearly not limited thereto, referring specifically to FIGS. 1 and 2, in select embodiments of the disclosed multi-modal diamond abrasive package or slurry 10, the relatively low total concentration of diamonds in the slurry 10 may include an 80 ct/gallon slurry 10, where the first particle size of 0.5 microns is 17 ct/gallon, and the second particle size of 3 microns is 63 ct/gallon. As another example, and clearly not limited thereto, referring now specifically to FIG. 1, in other select embodiments of the disclosed multi-modal diamond abrasive package or slurry 10, the relatively low total concentration of diamonds in the slurry 10 may include a 50 ct/gallon slurry 10, where the first particle size of 0.5 microns is 11 ct/gallon, and the second particle size of 3 microns is 39 ct/gallon. As shown in FIGS. 1-2, in these example embodiments, the improvements in material removal rates of the 80 ct/gallon slurry 10 or the 50 ct/gallon slurry 10 may surpass the material removal rates observed using a 3 micron diamond concentration of 160 ct/gallon.

Figure 3:
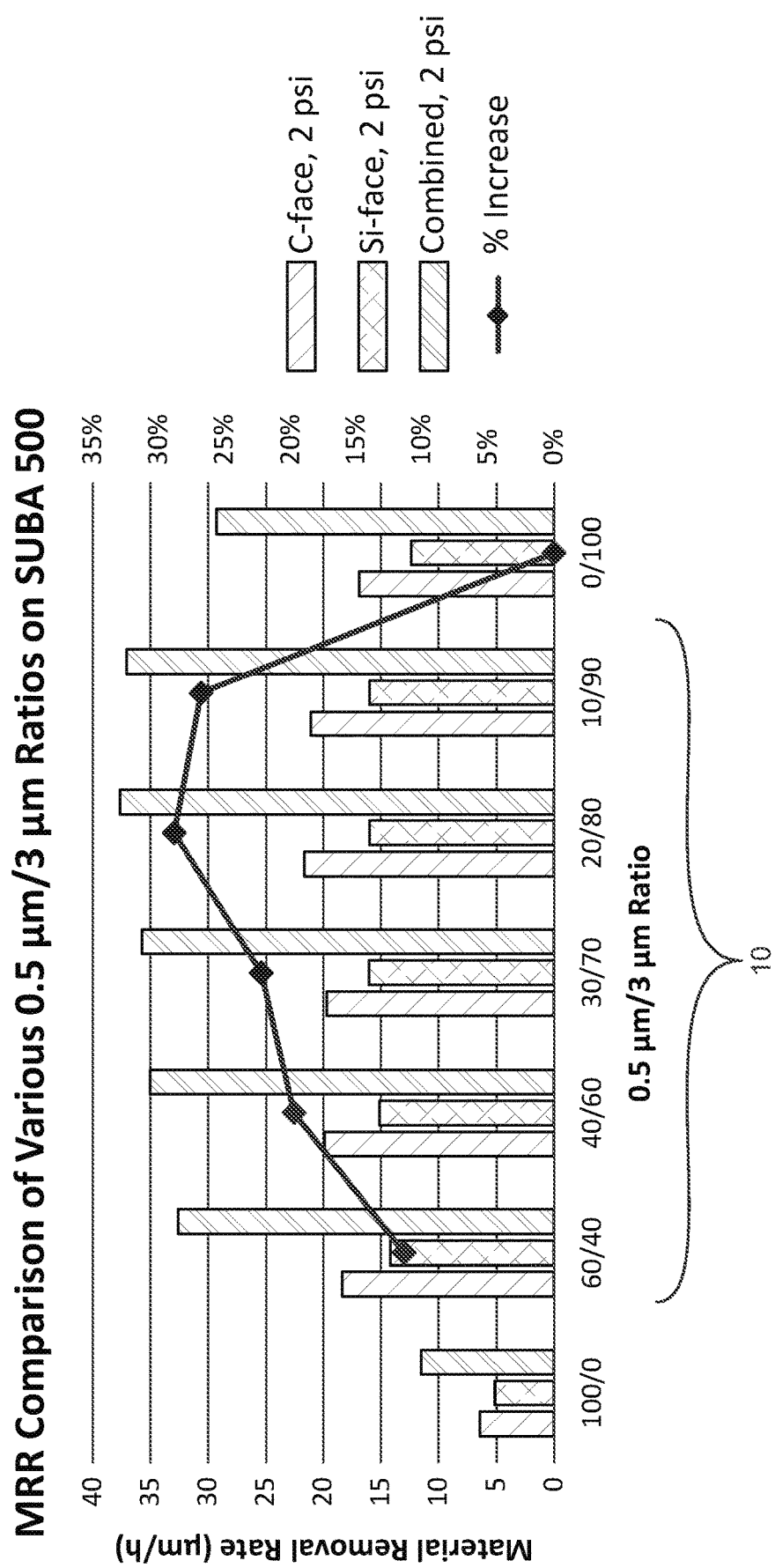
FIG. 3 is a bar and line graph of material removal rates of the various compositions of slurries listed in Table 4 according to select embodiments of the instant disclosure in micro-meters per hour ($\mu$m/h) of various 0.5 micrometer ($\mu$m) by 3 micrometer ($\mu$m) ratios according to select embodiments of the instant disclosure on a Suba™ 500 polishing pad from Eminess Technologies of Scottsdale, Ariz. at 2 psi.
Figure 4:
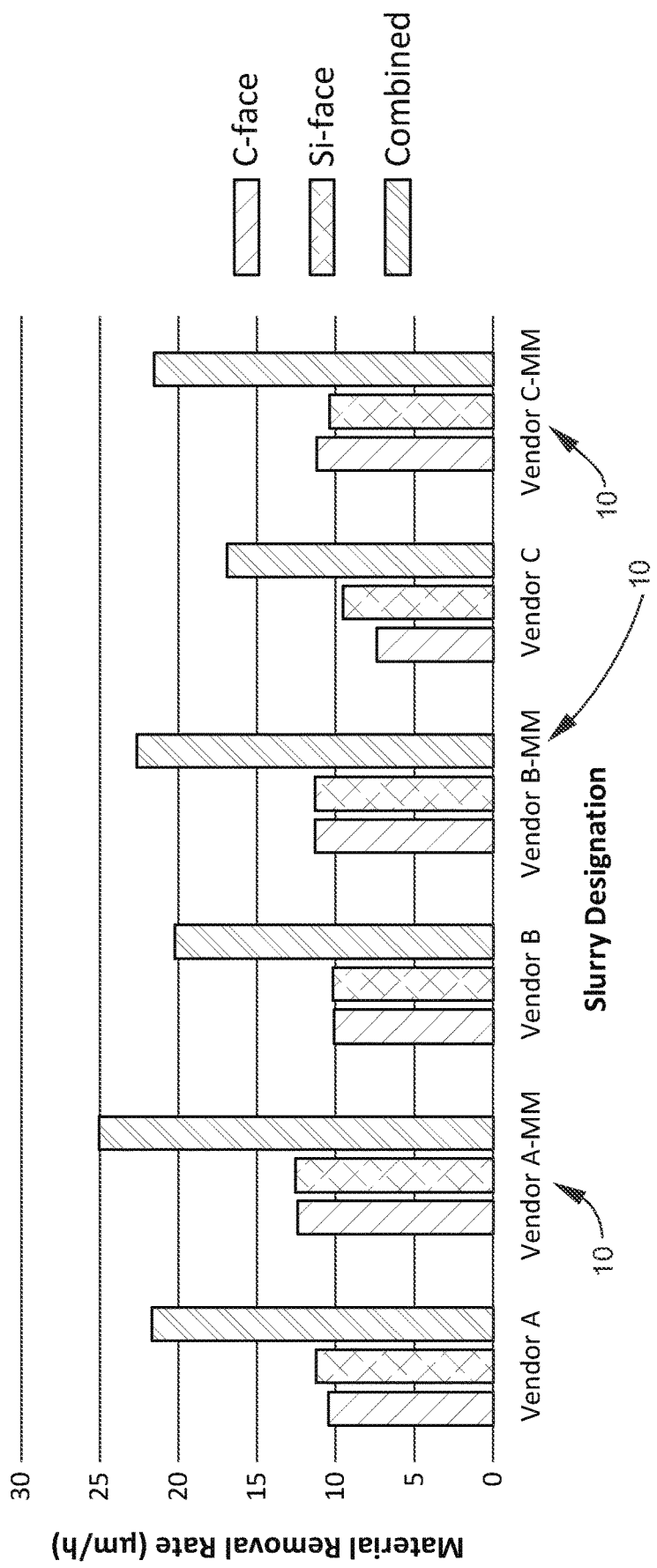
FIG. 4 is a bar graph of material removal rates of the various compositions of slurries listed in Table 5 according to select embodiments of the instant disclosure in micrometers per hour ($\mu$m/h) of various 1 micrometer ($\mu$m) slurries with multi-modal counterpart according to select embodiments of the instant disclosure at 4 psi.

Referring now specifically to FIG. 3, in select embodiments of the disclosed multi-modal diamond abrasive package or slurry 10, a ratio of the first particle size of the first diamond abrasive, and the second particle size of the second diamond abrasive may be between 60/40 and 10/90. In select possibly preferred embodiments, the ratio of the first particle size of the first diamond abrasive, and the second particle size of the second diamond abrasive may be approximately between 20/80 and 10/90. In select possibly most preferred embodiments, the ratio of the first particle size of the first diamond abrasive, and the second particle size of the second diamond abrasive may be approximately or equal to 20/80. In these select embodiments of the disclosed multi-modal diamond abrasive package or slurry 10, the first particle size of the first diamond abrasive may be 0.5 microns, and the second particle size of the second diamond abrasive may be 1 micron or 3 microns.

Figure 5:
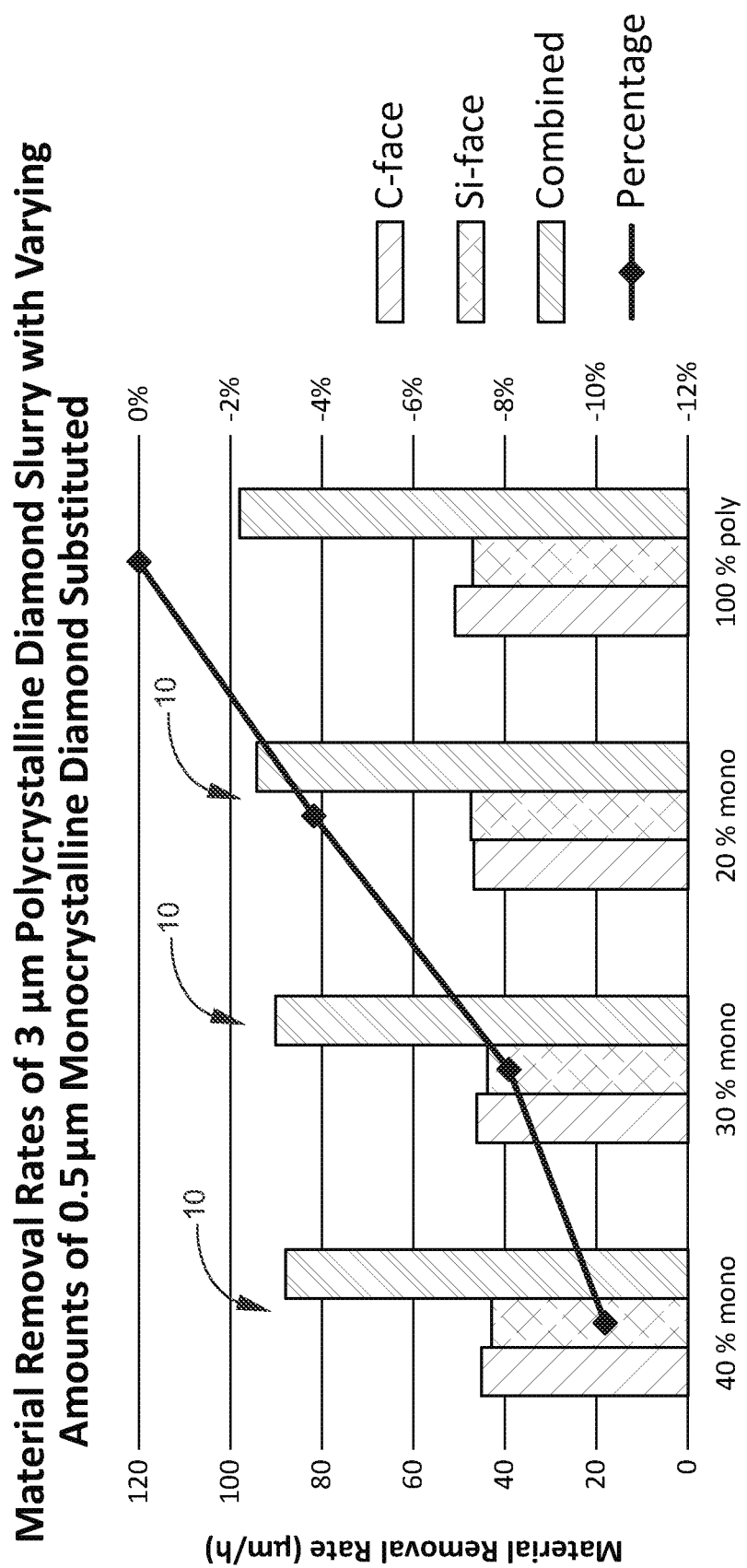
FIG. 5 is a bar and line graph of material removal rates of the various compositions of slurries listed in Table 6 according to select embodiments of the instant disclosure in micro-meters per hour ($\mu$m/h) of 3 micrometer ($\mu$m) polycrystalline diamond slurries with varying amounts of 0.5 micrometer ($\mu$m) monocrystalline diamond substituted.

Referring now specifically to FIG. 5, another feature of the disclosed multi-modal diamond abrasive package or slurry 10 may be that it can be configured to enable a cost savings. As shown in the example of FIG. 5, in select example embodiments, and clearly not limited thereto, the cost savings may be via a substitution of expensive polycrystalline diamond powder with inexpensive monocrystalline diamond powder while minimizing the reduction in the material removal rate. As shown in Table 6, the percentage of cost savings may be greater than the percentage of reduction in material removal rate. In select example embodiments, and clearly not limited thereto, as shown in FIG. 5 the percentage of cost savings may be approximately 3 times or more greater than the percentage of reduction in material removal rate.

Figure 6:
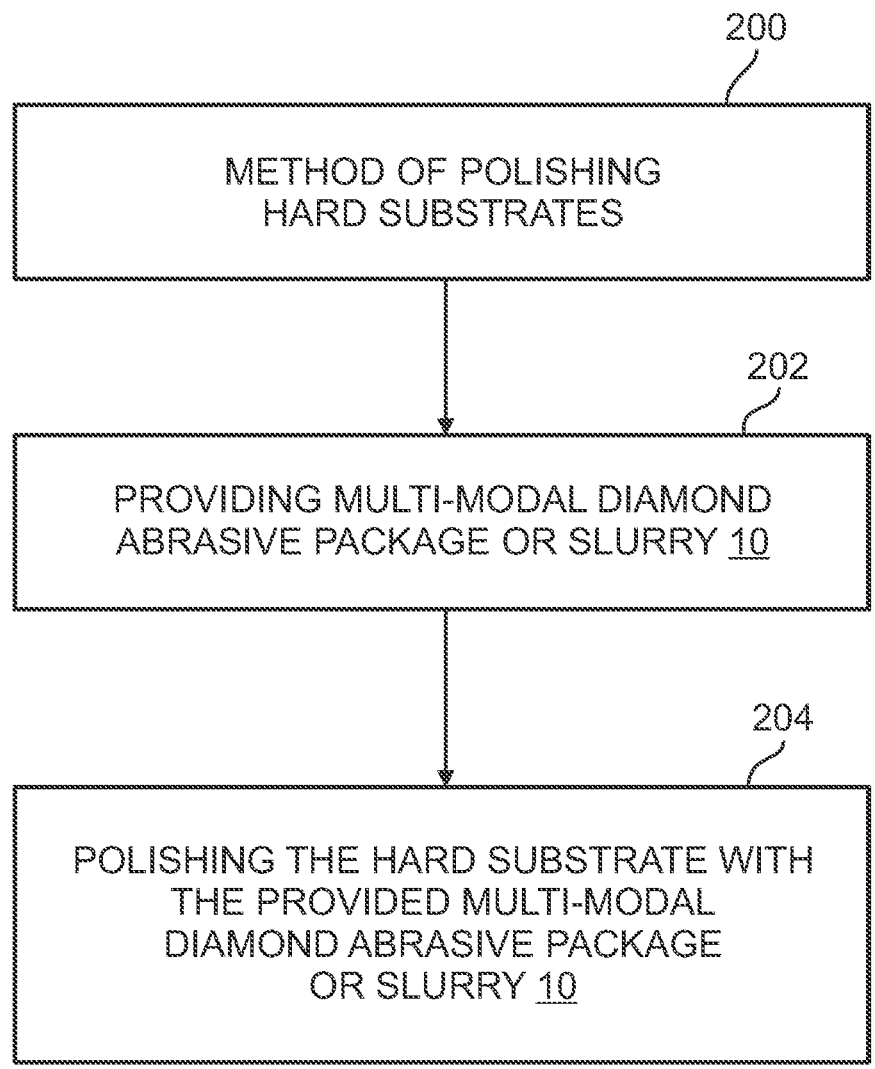
FIG. 6 is a flow chart of the method of polishing hard substrates according to select embodiments of the instant disclosure.

Referring now to FIG. 6, in another aspect, the instant disclosure embraces method 200 of polishing of hard substrates, including, but not limited to silicon carbide (SiC), sapphire, or gallium nitride (GaN), the like, and combinations thereof. Method 200 of polishing of hard substrates may generally include step 202 of providing the multi-modal diamond abrasive package or slurry 10 in any of the various embodiments or combinations of embodiments shown and/or described herein. As such, the provided multi-modal diamond abrasive package or slurry 10 for polishing the hard substrates may generally include the plurality of diamond abrasives, where each one of the diamond abrasives of the plurality of diamond abrasives has a particle size. The multi-modal diamond abrasive package or slurry can include a first diamond abrasive with a first particle size, and a second diamond abrasive with a second particle size. Wherein, the first particle size of the first diamond abrasive may be smaller than the second particle size of the second diamond abrasive. With the provided multi-modal diamond abrasive package or substrate, method 200 may further include step 204 of polishing the hard substrate with the provided multi-modal diamond abrasive package or slurry. Step 204 of polishing the hard substrate with the provided multi-modal diamond abrasive package or slurry may be carried out by any means known and/or later discovered for polishing hard substrates, like to silicon carbide (SiC), sapphire, or gallium nitride (GaN), the like, and combinations thereof.

EXAMPLES

As shown in FIGS. 1-5, sample slurries 10 were prepared and tested to determine the material removal rate (MRR) of silicon-carbide (SiC) wafers. The MRR of the SiC wafers were measured using the following procedure. A 3-inch SiC wafer from TanKeBlue Semiconductor of Beijing, China was polished in 15-minute increments for most of the experiments described below. Wafers were polished in 10-minute increments for the large diamond (≥3 μm) polycrystalline diamond experiments as a result of very high observed material removal rates. The polishing tool was a Spectrum System 2000 Grinder and Polisher provided by LECO® Corporation of St. Joseph, Mo.

Various 12-inch diameter pads were used for different experiments, including Suba™ 500, Suba™ 800, and MH pads, all from Eminess Technologies of Scottsdale, Ariz. The SiC wafers for all experiments were contained within a template assembly with E310 backer material, NTA E310, manufactured by Eminess Technologies of Scottsdale, Ariz. The LECO® tool, provided by LECO® Corporation of St. Joseph, Mo., allows rotational velocities for both the head and platen to be set independently; however, for the purposes of these experiments, both the head and the platen were set to operate at 125 RPM clockwise (CW). To ensure wafer uniformity throughout the experiments, the wafers were rotated 90-degrees after each polishing increment. Two different operating downforce pressures were used for different experiments which were 2 psi and 4 psi. For the initial experiments involving the monocrystalline multi-modal (MM) slurries, slurry 10 was applied at a drip rate of 25 mL/min; however, the drip rate for all other experiments involving polycrystalline diamond slurries was at 20 mL/min.

To determine the MRR for each increment, the wafer was weighed before and after each polishing step. Using the assumption that the wafers are a perfect cylinder with a radius of 1.5-inch, the MRR was calculated based on the mass difference measured after each run and the density of SiC. The mass and density were used to determine the total volume removed and corresponding height of the cylinder. Then dividing by the respective time increment for each experiment (10- or 15-minutes), two to three data points for both the Si-face and C-face were collected for each slurry composition, and then those data points were averaged. The average data points are shown in the various tables and figures shown herein the instant disclosure.

Example 1

Example 1 is for a mono-modal versus multi-modal monocrystalline diamond slurry 10. The uniqueness of using a multi-modal diamond abrasive package as compared to a mono-modal diamond abrasive package is exemplified by the following experiments. Five slurry compositions were manufactured to identical specifications except the identity of the diamond abrasive package. The diamond abrasive selection and concentration for each of the five compositions is listed in Table 1 below.

TABLE 1

| Composition | 3 μm ct/gallon | 0.5 μm ct/gallon |
| --- | --- | --- |
| 1 | 63 | — |
| 2 | 100 (FIG. 1) | — |
|   | 80 (FIG. 2) |   |
| 3 | 160 | — |
| 4 | 63 | 17 |
| 5 | 39 | 11 |

The material removal rates of each composition were determined via polishing tests previously described and are presented in FIG. 1 in graphical form and listed in Table 2 below. The polishing pad for this experiment was Suba™ 500 from Eminess Technologies of Scottsdale, Ariz.

TABLE 2

| Composition | Si Face MRR | C Face MRR | Total MRR |
| --- | --- | --- | --- |
| 1 | 8.2 | 8.9 | 17.1 |
| 2 | 9.3 | 12.6 | 21.9 |
| 3 | 11.8 | 16.3 | 28.1 |
| 4 | 15.3 | 17 | 32.3 |
| 5 | 14.5 | 17.7 | 32.2 |

To validate the observation on another type of polishing pad, the following experiment using Suba™ 800 from Eminess Technologies of Scottsdale, Ariz. was performed. The material removal rates of compositions 1-4 were determined via polishing tests previously described and are presented in FIG. 2 in graphical form, and listed in Table 3 below.

TABLE 3

| Composition | Si Face MRR | C Face MRR | Total MRR |
| --- | --- | --- | --- |
| 1 | 9.1 | 9.8 | 18.9 |
| 2 | 9.5 | 11.8 | 21.3 |
| 3 | Not Tested | 14 | NA |
| 4 | 12.9 | 14.9 | 27.8 |

The aforementioned experiments show that the disclosed inventive compositions, IC 80 ct/gal and IC 50 ct/gal, containing both a 0.5 micron and a 3 micron monocrystalline diamond particles in a multi-modal configuration provides significant improvements in material removal for both faces of the SiC wafer while maintaining a relatively low total concentration of diamonds in the slurry 10 at or below 80 cts/gal, even surpassing the material removal rate observed using a 3 micron diamond concentration of 160 cts/gal.

Example 2

Example 2 is for a linear compositional study between 0.5 μm and 3 μm monocrystalline diamond slurries. The utility of a multi-modal diamond abrasive package 10 can be further recognized by the following experiment. Seven slurry compositions were manufactured to identical specifications except the identity of the monocrystalline diamond abrasive package. The diamond concentration per gallon was held constant but the relative quantity of 0.5 μm and 3 μm diamonds was varied from all 0.5 μm to all 3 μm. The material removal rates are shown in FIG. 3 in graphical form and listed in Table 4 below. FIG. 3 provides the relative increase in the MRR for the multi-modal diamond abrasive combinations relative to the slurry containing only 3 μm monocrystalline diamond. This experiment used a Suba™ 500 polishing pad from Eminess Technologies of Scottsdale, Ariz. at 2 psi polishing pressure.

TABLE 4

| Ratio<br>0.5 μm:3.0 μm | Si Face<br>MRR | C Face<br>MRR | Total<br>MRR |
|---|---|---|---|
| 100/0 | 5.1 | 6.4 | 11.5 |
| 60/40 | 14.2 | 18.4 | 32.6 |
| 40/60 | 15.1 | 19.9 | 35 |
| 30/70 | 16 | 19.7 | 35.7 |
| 20/80 | 16 | 21.7 | 37.7 |
| 10/90 | 16 | 21.1 | 37.1 |
| 0/100 | 12.4 | 16.9 | 29.3 |

The aforementioned experiments show that the disclosed inventive compositions containing a multi-modal diamond abrasive package add considerable increase in MRR compared to a mono-modal diamond abrasive package and that there exists an optimum ratio of the two diamond sizes. However, the instant disclosure considers that the optimum ratio of another combination of diamond abrasives could be different.

Example 3

Example 3 is a comparison of 1 μm polycrystalline diamond slurry with multi-modal slurry 10 counterpart. The utility of a multi-modal diamond abrasive package 10 can be further recognized by the following experiment. Six slurry compositions were manufactured to identical specifications except the identity of the diamond abrasive package. Three different suppliers provided the 1 μm polycrystalline diamond powder. The diamond concentration per gallon was held constant and three 1 μm polycrystalline diamond abrasive slurries were compared to their multi-modal counterparts that used 0.5 μm monocrystalline diamond to replace some of the 1 μm polycrystalline diamond. The material removal rates are shown in FIG. 4 in graphical form and listed in Table 5 below. FIG. 4 provides the relative increase for the multi-modal diamond abrasive slurry 10 combinations relative to the slurries containing only 1 μm polycrystalline diamond. This experiment used an MH polishing pad at 4 psi polishing pressure.

TABLE 5

| Composition<br>MM = Multi-Modal | Si Face<br>MRR | C Face<br>MRR | Total<br>MRR |
|---|---|---|---|
| Vendor A | 11.2 | 10.5 | 21.7 |
| Vendor A-MM | 12.6 | 12.5 | 25.1 |
| Vendor B | 10.2 | 10.1 | 20.3 |
| Vendor B-MM | 11.3 | 11.3 | 22.6 |
| Vendor C | 9.6 | 7.4 | 17 |
| Vendor C-MM | 10.4 | 11.2 | 21.6 |

The aforementioned experiment shows that the disclosed inventive compositions containing a multi-modal diamond abrasive package add considerable increase in MRR compared to a mono-modal diamond abrasive package and that it can be applied across multiple vendors that provide somewhat dissimilar 1 μm polycrystalline diamond powder.

Example 4

Example 4 is for the utility of substituting large 3 μm polycrystalline diamond powder with small 0.5 μm monocrystalline diamond powder to make a multi-modal diamond abrasive package for polishing slurries. The utility of a multi-modal diamond abrasive package can be even further recognized by the following experiment. Four slurry compositions were manufactured to identical specifications except the identity of the diamond abrasive package. One slurry utilized only 3 μm polycrystalline diamond and the other three slurries 10 replaced either 20, 30 or 40% of the polycrystalline diamond with 0.5 μm monocrystalline diamond powder. The total diamond concentration per gallon was held constant. The material removal rates are shown in FIG. 5 in graphical form and listed in Table 6 below along with a relative cost analysis. FIG. 5 provides the MRRs for each of the slurry compositions along with the relative cost reduction as you replace polycrystalline 3 μm diamond with 0.5 μm monocrystalline diamond powder. These experiments were run on an MH pad and at 4 psi downforce.

The cost analysis utilizes cost of polycrystalline diamond powder and monocrystalline diamond powder at $2.00 and $0.2 per carat, respectively. The total carats per gallon was fixed at 30.

TABLE 6

| Composition | Si Face<br>MRR | C Face<br>MRR | Total<br>MRR | Cost Δ | MRR Δ |
|---|---|---|---|---|---|
| 100% Poly | 47.1 | 50.8 | 97.9 | — | — |
| 20% Mono | 47.4 | 46.8 | 94.2 | −18% | −3.8% |
| 30% Mono | 43.9 | 46.1 | 90 | −27% | −8.1% |
| 40% Mono | 42.9 | 45.1 | 88 | −36% | −10.2% |

This experiment shows that the disclosed inventive compositions containing a multi-modal diamond abrasive package 10 can enable significant cost savings via substitution of expensive polycrystalline diamond powder with inexpensive monocrystalline diamond powder while minimizing the reduction in MRR.

In the specification and/or figures, typical embodiments of the disclosure have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

The foregoing description and drawings comprise illustrative embodiments. Having thus described exemplary embodiments, it should be noted by those skilled in the art that the within disclosures are exemplary only, and that various other alternatives, adaptations, and modifications may be made within the scope of the present disclosure. Merely listing or numbering the steps of a method in a certain order does not constitute any limitation on the order of the steps of that method. Many modifications and other embodiments will come to mind to one skilled in the art to which this disclosure pertains having the benefit of the teachings presented in the foregoing descriptions and the associated drawings. Although specific terms may be employed herein, they are used in a generic and descriptive sense only and not for purposes of limitation. Accordingly, the present disclosure is not limited to the specific embodiments illustrated herein but is limited only by the following claims.

The invention claimed is:

1. A multi-modal diamond abrasive package or slurry for polishing hard substrates
comprising:
　a plurality of diamond abrasives, where each one of the diamond abrasives of the plurality of diamond abrasives has a particle size, where the multi-modal diamond abrasive package or slurry comprises:
　　a first monocrystalline or polycrystalline diamond abrasive with a first particle size; and
　　a second monocrystalline or polycrystalline diamond abrasive with a second particle size;
　wherein, the first particle size of the first monocrystalline or polycrystalline diamond abrasive is smaller than the second particle size of the second monocrystalline or polycrystalline diamond abrasive, wherein:
　　the first particle size of the first monocrystalline or polycrystalline diamond abrasive is between 0.01 microns and 1.00 microns; and
　　the second particle size of the second monocrystalline or polycrystalline diamond abrasive is between 0.5 microns and 10 microns;
　wherein, the multi-modal diamond abrasive package or slurry is configured to provide an improvement in material removal rates for both faces of the hard substrate while maintaining a lower total concentration of diamonds in the slurry compared to a mono-modal diamond slurry at approximately a same concentration of diamonds, wherein the lower total concentration of diamonds in the slurry is approximately 80 ct/gallon or less, wherein the provided improvement in the material removal rates at approximately the same total concentration of diamonds in the slurry is approximately 10% or more.

2. The multi-modal diamond abrasive package or slurry of claim 1 being configured to maintain or allow for higher material removal rates with a lower diamond abrasive loading in the slurry compared to a mono-modal diamond slurry at approximately a same concentration of diamonds.

3. The multi-modal diamond abrasive package or slurry of claim 2, wherein:
　the multi-modal diamond abrasive package or slurry maintains a water based environmentally friendly composition;
　the multi-modal diamond abrasive package or slurry is configured to provide an improvement in a material removal rate while allowing for a reduced concentration of diamonds needed to obtain the improved material removal rate compared to the mono-modal diamond slurry at approximately the same concentration of diamonds;
　or
　combinations thereof.

4. The multi-modal diamond abrasive package or slurry of claim 1, wherein:
　the first particle size of the first monocrystalline or polycrystalline diamond abrasive is 0.5 microns; and
　the second particle size of the second monocrystalline or polycrystalline diamond abrasive is 1 micron or 3 microns.

5. The multi-modal diamond abrasive package or slurry of claim 4, being configured to provide an improvement in material removal rates for both faces of a silicon carbide wafer while maintaining a relatively low total concentration of diamonds in the slurry compared to a mono-modal diamond slurry at approximately a same concentration of diamonds, where the relatively low total concentration of diamonds in the slurry include:
　an 80 ct/gallon slurry, where the first particle size of 0.5 microns is 17 ct/gallon, and the second particle size of 3 microns is 63 ct/gallon; or
　a 50 ct/gallon slurry, where the first particle size of 0.5 microns is 11 ct/gallon, and the second particle size of 3 microns is 39 ct/gallon.

6. The multi-modal diamond abrasive package or slurry of claim 5, wherein the improvements in the material removal rates of the 80 ct/gallon slurry or the 50 ct/gallon slurry surpass the material removal rates observed using a 3 micron diamond concentration of 160 ct/gallon.

7. The multi-modal diamond abrasive package or slurry of claim 1, wherein a ratio of the first particle size of the first monocrystalline or polycrystalline diamond abrasive, and the second particle size of the second monocrystalline or polycrystalline diamond abrasive is between 60/40 and 10/90.

8. The multi-modal diamond abrasive package or slurry of claim 7, wherein the ratio of the first particle size of the first monocrystalline or polycrystalline diamond abrasive, and the second particle size of the second monocrystalline or polycrystalline diamond abrasive is approximately between 20/80 and 10/90.

9. The multi-modal diamond abrasive package or slurry of claim 8, wherein the ratio of the first particle size of the first monocrystalline or polycrystalline diamond abrasive, and the second particle size of the second monocrystalline or polycrystalline diamond abrasive is approximately or equal to 20/80.

10. The multi-modal diamond abrasive package or slurry of claim 7, wherein:
　the first particle size of the first monocrystalline or polycrystalline diamond abrasive is 0.5 microns; and
　the second particle size of the second monocrystalline or polycrystalline diamond abrasive is 1 micron or 3 microns.

11. The multi-modal diamond abrasive package or slurry of claim 1 being configured to enable a cost savings compared to a mono-modal diamond slurry at approximately a same concentration of diamonds in a polycrystalline diamond powder, wherein the cost savings is via a substitution of the polycrystalline diamond powder with monocrystalline diamond powder while minimizing the reduction in a material removal rate, wherein a percentage of cost savings is greater than a percentage of reduction in material removal rate, wherein the percentage of cost savings is approximately 3 times or more greater than the percentage of reduction in material removal rate.

12. A multi-modal diamond abrasive package or slurry for polishing hard substrates
comprising:
- a plurality of diamond abrasives, where each one of the diamond abrasives of the plurality of diamond abrasives has a particle size, where the multi-modal diamond abrasive package or slurry comprises:
  - a first monocrystalline or polycrystalline diamond abrasive with a first particle size of 0.5 microns; and
  - a second monocrystalline or polycrystalline diamond abrasive with a second particle size of 1 micron or 3 microns;
  - wherein a ratio of the first particle size of the first monocrystalline or polycrystalline diamond abrasive, and the second particle size of the second monocrystalline or polycrystalline diamond abrasive is approximately between 20/80 and 10/90;
  - wherein, the first particle size of the first monocrystalline or polycrystalline diamond abrasive is smaller than the second particle size of the second monocrystalline or polycrystalline diamond abrasive;
- wherein, the multi-modal diamond abrasive package or slurry is configured to maintain or allow for higher material removal rates with a lower diamond abrasive loading in the slurry compared to a mono-modal diamond slurry at approximately a same concentration of diamonds;
- wherein, the multi-modal diamond abrasive package or slurry maintains a water based environmentally friendly composition;
- wherein, the multi-modal diamond abrasive package or slurry is configured to provide an improvement in a material removal rates while allowing for a reduced concentration of diamonds needed to obtain the improved material removal rates compared to the mono-modal diamond slurry at approximately the same concentration of diamonds;
- wherein, the multi-modal diamond abrasive package or slurry is configured to provide the improvement in the material removal rates for both faces of a silicon carbide wafer while maintaining a lower total concentration of diamonds in the slurry compared to the mono-modal diamond slurry at approximately the same concentration of diamonds, where the relatively low total concentration of diamonds in the slurry is approximately 80 ct/gallon or less, wherein the provided improvement in the material removal rates at approximately the same total concentration of diamonds in the slurry is approximately 10% or more;
- wherein, the multi-modal diamond abrasive package or slurry is configured to enable a cost savings via a substitution of polycrystalline diamond powder with monocrystalline diamond powder while minimizing the reduction in a material removal rate, wherein a percentage of cost savings is approximately 3 times or more greater than a percentage of reduction in material removal rate.

13. The multi-modal diamond abrasive package or slurry of claim 12,
wherein the provided improvements in the material removal rates for both faces of a silicon carbide wafer while maintaining a relatively low total concentration of diamonds in the slurry compared to the mono-modal diamond slurry at approximately the same concentration of diamonds, where the relatively low total concentration of diamonds in the slurry include:
- an 80 ct/gallon slurry, where the first particle size of 0.5 microns is 17 ct/gallon, and the second particle size of 3 microns is 63 ct/gallon; or
- a 50 ct/gallon slurry, where the first particle size of 0.5 microns is 11 ct/gallon, and the second particle size of 3 microns is 39 ct/gallon;
wherein the improvements in the material removal rates of the 80 ct/gallon slurry or the 50 ct/gallon slurry surpass the material removal rates observed using a 3 micron diamond concentration of 160 ct/gallon.

* * * * *